United States Patent [19]
Altman et al.

[11] Patent Number: 4,544,911
[45] Date of Patent: Oct. 1, 1985

[54] LOW COST MONOTONIC DIGITAL-TO-ANALOG CONVERTER

[75] Inventors: Ted N. Altman, E. Windsor; Nicola J. Fedele, Kingston, both of N.J.

[73] Assignee: RCA Corporation, Princeton, N.J.

[21] Appl. No.: 528,046

[22] Filed: Aug. 31, 1983

[51] Int. Cl.⁴ .............................................. H03K 13/02
[52] U.S. Cl. ...................... 340/347 DA; 340/347 CC; 455/179
[58] Field of Search ................. 340/347 CC, 347 DA; 455/184, 195, 179, 169, 164

[56] References Cited
U.S. PATENT DOCUMENTS 4,258,355  3/1981  Edwards ...................... 340/347 DA
4,364,026 12/1982  Steckler ...................... 340/347 DA
4,374,437  2/1983  Citta .................................. 455/184
4,410,879 10/1983  Gumm ........................ 340/347 CC
4,415,882 11/1983  Akazawa et al. .................... 340/347

FOREIGN PATENT DOCUMENTS 1492263 11/1977 United Kingdom .
2086161A  5/1982 United Kingdom .

OTHER PUBLICATIONS

U.S. patent application entitled Digital-to-Analog Converter Useful in a Television Receiver, filed Jul. 28, 1983, in the name of C. M. Wine and assigned like the present application to RCA Corporation.

Primary Examiner—Charles D. Miller
Attorney, Agent, or Firm—Eugene M. Whitacre; Peter M. Emanuel; Lawrence C. Edelman

[57] ABSTRACT

A digital-to-analog converter generates an analog output signal which is subject to periodically occurring non-monotonic increments in response to consecutive increments of the value of a digital word. Apparatus in accordance with the present invention substantially reduces effects of the non-monotonic increments from disturbing the analog output signal by rapidly incrementing the value of the digital word after the occurrence of each of said non-monotonic increments.

17 Claims, 5 Drawing Figures

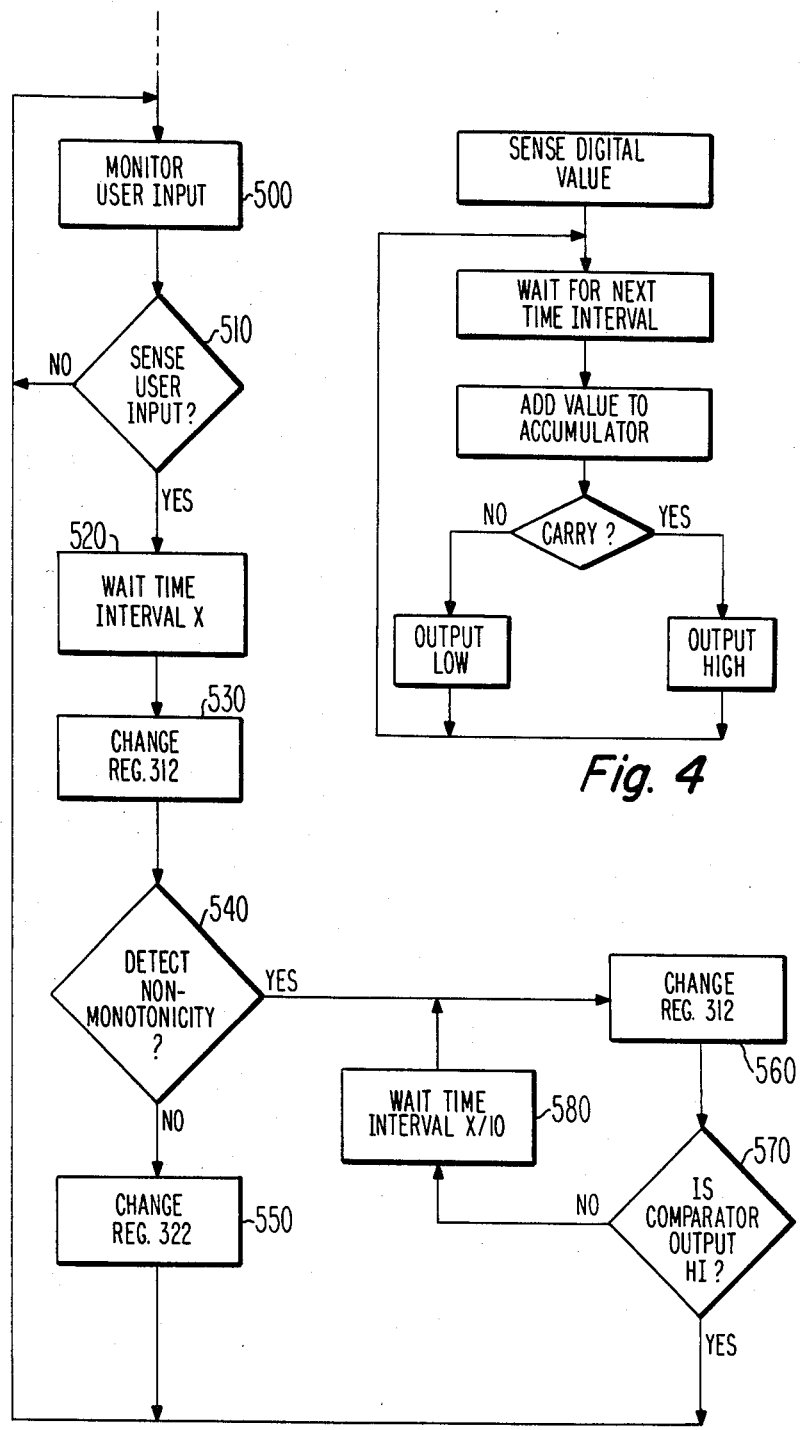

LOW COST MONOTONIC DIGITAL-TO-ANALOG CONVERTER

The present invention relates to a digital-to-analog converter (DAC) and more particularly to a low cost but high resolution DAC.

DACs convert digital words to corresponding analog signals and are consequently widely used. For example, in a tuning system for a radio or TV receiver, a DAC may be used to convert a digital word generated in response to viewer control, to a tuning voltage for application to voltage controlled frequency selective devices in the tuner, such as varacter diodes, for tuning the receiver.

The performance of a DAC is generally measured in terms of its resolution (number of increments), absolute accuracy (accuracy of actual analog output signal with respect to ideal output signal), and speed of operation.

U.S. patent application Ser. No. 518,146 entitled "Digital-to-Analog Converter Useful In A Television Receiver" filed in the name of C. M. Wine on July 28, 1983 and assiged, like the present application, to RCA Corporation, describes a DAC wherein its absolute accuracy is relaxed in order to provide high resolution with low cost. More specifically, the accuracy is relaxed to the point where its output performance is deliberately made non-monotonic. A DAC in accordance with the Wine application generates a first incrementally variable duty factor signal in response to a group of the most significant bits of a digital word and a second incrementally variable duty factor signal in response of the next most significant bits of the digital word. The amplitude of the first and second signals are differentially weighted such that the maximum average DC value of the second signal is greater than the value of a single increment of the first signal. The weighted signals are combined and filtered by a lowpass filter which derives the analog signal. Due to this type of differential weightirg, the tolerance required for the values of the resistors used for performing the weighting function is substantially eased, thus reducing the cost of the DAC. Since the total contribution of the second signal is greater than one incremental value of the first signal, the DAC output includes non-monotonic portions. However, the full range of analog signal levels can still be derived and with a high resolution.

In some applications, such as a tuning voltage ramp generator for a sweep type TV tuner, a non-monotonic output may be undesirable since at each non-monotonic increment there is an abrupt change in the tuning voltage. The present invention is directed to apparatus for providing a monotonic output for the above described DAC.

In accordance with the principles of the present invention, apparatus is provided for storing a signal level corresponding to an analog signal level provided by the DAC before the occurrence of a non-monotonic increment, and rapidly incrementing the value of the digital word so as to increment the analog signal level until the analog signal level again corresponds to the stored signal level. In this manner, the values of the digital word which correspond to the non-monotonic portions of the DAC output are rapidly passed by and, due to the low-pass filter, the level of the analog signal remains substantially monotonic.

In the drawings:

FIGS. 4 and 5 illustrate respective flow charts of portions of a microcomputer control program for the DAC of FIG. 3.

Figure 1:
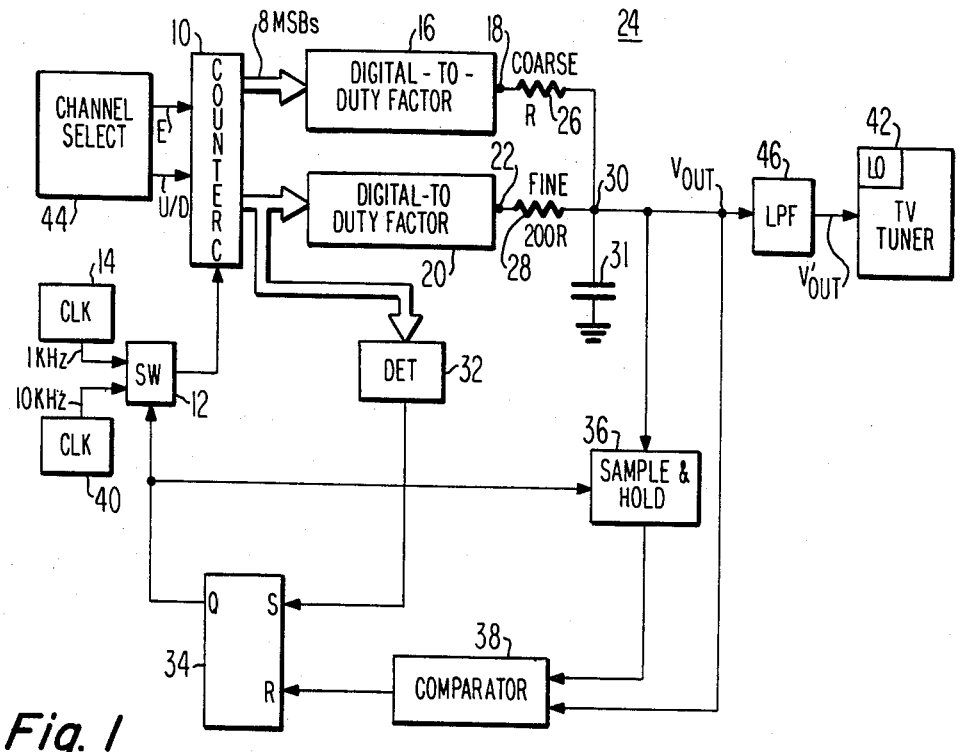
FIG. 1 illustrates, partially in block diagram form and partially in schematic diagram form, a DAC constructed in accordance with the principles of the invention.

Referring to FIG. 1, a 16-bit counter 10 provides a digital word having a value variable between 0 and $2^{16}$ (65,536). A single-pole, double-throw switch 12 normally provides a relatively slow (e.g., 1 KHz) clock signal from clock source 14 to a clock (C) input of counter 10 for periodically and uniformly changing the value of the digital word. Counter 10 is responsive to the high logic level of a U/D ("Up/Down") signal for changing the value of the digital word in the positive sense (i.e, counting up) and a low logic level of the U/D signal for changing the value of the digital word in the negative sense (i.e., counting "down"). Additionally, counter 10 is responsive to an enable signal (E) for enabling it to count in response to the applied clock signal.

For each incremental value of the 16-bit digital word, the eight most significant bits (MSBs) are applied (as indicated by the broad arrow) to a digital-to-duty factor converter 16 for providing an output pulse signal (COARSE) at terminal 18. The COARSE signal has an average DC value representative of the value of the eight MSBs of the digital word.

Converter 16 may be constructed using a binary rate multiplier, which provides a plurality of uniformly short duration output pulses proportional in number in a given conversion period to the value of the eight MSBs. More specifically, converter 16 may be constructed by cascading in the "add" mode two 4-bit binary rate multiplier circuits, such as the CD4089 integrated circuit, manufactured by RCA Corporation, Solid State Division, Somerville, N.J., as shown in the 1978 RCA COS/MOS Integrated Circuits Data Book in FIG. 13 on page 246.

In a similar manner, the eight least significant bits (LSBs), the remaining bits of the digital word stored in counter 10, are applied (as indicated by the broad arrow) to a digital-to-duty factor converter 20, for providing an output pulse signal (FINE) at terminal 22 similar to the pulse signal provided at terminal 18 but, having a duty factor representative of the eight LSBs.

If the COARSE and FINE signals were combined such that the maximum incremental contribution of the FINE signal was precisely one FINE increment less than a single incremental contribution of the COARSE signal a uniformly monotonic output would be achieved. Furthermore, if the contribution of a single increment of the COARSE signal was greater than that indicated above, the output function would remain monotonic, but not uniform, and a group of analog output levels would be skipped (i.e., not derivable).

However, in accordance with the teachings of the previously noted Wine application, the COARSE and FINE signals of FIG. 1 are combined in a manner so as to deliberately produce a non-monotonic output. Consequently, the combining may be accomplished using lower cost, standard tolerance resistors (e.g., 10%) without the possibility of having a non-uniform monotonic output wherein output levels would be skipped.

More specifically, a lowpass filter 24 includes a standard tolerance (e.g., ±10%) resistor 26 coupled to terminal 18 and a standard tolerance resistor 28 coupled to terminal 22 for combining the pulse output signals from converters 16 and 20 at a junction 30. The voltage divider action provided by resistors 26 and 28 differentially attenuate or weight the COARSE and FINE signals such that at junction 30, the maximum average DC value of the FINE signal is greater than the average DC value of a single increment of the COARSE signal. A capacitor 31 coupled between junction 30 and ground smooths the weighted and combined signal for developing the analog signal.

If uniform monotonicity were desired, a differential weighting of 256:1 would be required to be provided by resistors 26 and 28. This can be mathematically expressed as:

$$R_f = 256 R_c$$

where $R_f$ equals the actual resistance value of resistor 28 and $R_c$ equals the actual resistance value of resistor 26. The tolerance of the attenuation required by resistors 26 and 28 for assuring uniform monotonicity is 1 part in $2^{16}$ (65,536) or 0.0015%.

The relationship of the resistance values of resistors 26 and 28 for attenuating the COARSE and FINE signals so as to produce the above-described non-monotonic output can be expressed as:

$$R_f < 256 R_c$$

When taking the tolerance of the resistors into account the above inequality can be expressed as:

$$R_f(1 \pm \text{tol.}) < 256 R_c(1 \pm \text{tol.})$$

If it were decided to use, for example, 10% tolerance resistors, the effect of the worst case resistance value variation would be:

$$\frac{R_f}{R_c} < \frac{256 - 25.6}{1 + .1} = \frac{230.4}{1.1} = \frac{209}{1}$$

Therefore, using 10% tolerance resistors having a nominal resistance value ratio of 200:1 for resistors 28 and 24, respectively, would be more than sufficient to guarantee a non-monotonic output in which all output levels are available. For example, resistor 26 can have a nominal value of 1 kilohm and resistor 28 can have a nominal value of 200 kilohms. As the nominal resistor value ratio is increased from 200:1 to 256:1, the amount of non-monotonicity is decreased and the tolerance required of resistors 26 and 28 is correspondingly tightened. Conversely, as the ratio is decreased from 200:1, correspondingly greater tolerance resistors can be used since the amount of non-monotonicity is increased.

Figure 2:
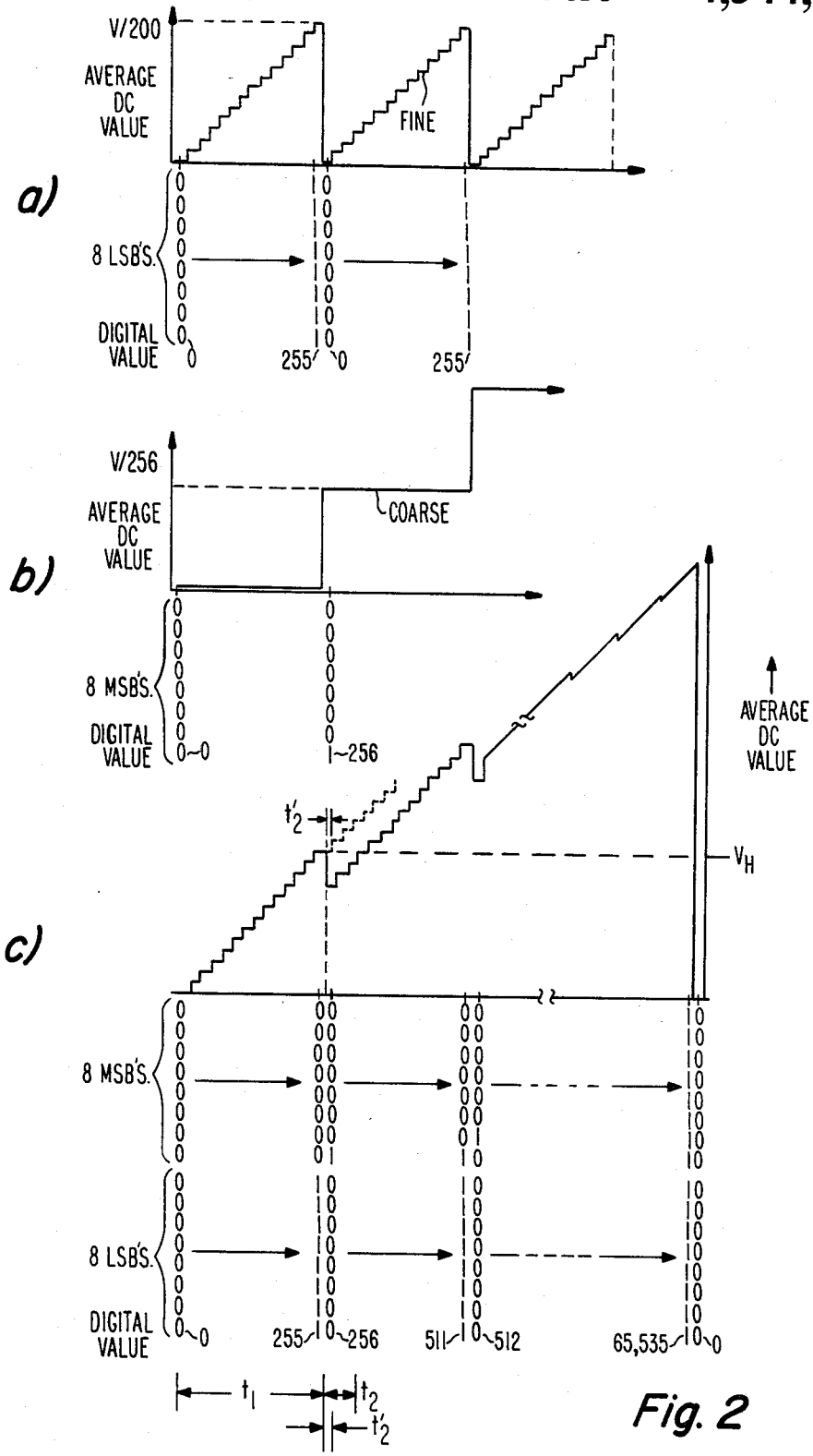
FIG. 2 illustrates waveforms useful for understanding the operation of the DAC of FIG. 1.

The waveforms of FIG. 2 illustrate the above-described weighting and combining of the COARSE and FINE signals. Waveform "a" illustrates the incremental average DC values of the FINE signal which would appear at junction 26 if the COARSE signal were not present and the count of counter 10 was changed in the positive sense. Each illustrated vertical increment is representative of approximately twenty actual increments of the digital value of counter 10. The digital value is indicated along the horizontal axis. Since the FINE signal is generated in response to the 8 LSBs of the digital word, a repeating staircase having 255 increments of average DC value is illustrated in waveform "a". The maximum average DC value after 255 increments would be V/200 if 200:1 weighting were providing by resistors 22 and 24 and the amplitude of the pulses provided at terminal 18 was V.

Waveform "b" illustrates several increments of the COARSE signal which would appear at junction 26 if the FINE signal was not present. Since the COARSE signal is generated in response to the 8 MSBs of the digital word, the digital value corresponding to a single increment of the COARSE signal is equal to 256 increments of the FINE signal. This is clearly indicated by the occurrence of one amplitude increment of waveform "b" after 255 amplitude increments of waveform "a". The average DC value of each increment of the COARSE signal is V/256. However, as previously noted, the maximum average DC value of the FINE signal is V/200. Thus, when waveforms "a" and "b" are combined, as illustrated in waveforms "c", it is evident that the maximum average DC value after 255 increments of the FINE signal is not one FINE increment less than one increment of the COARSE signal, as would be the case for a uniformly monotonic DAC, but it is greater than the average DC value of a single increment of the COARSE signal by a fixed amount. In the illustrative embodiment this amount corresponds to 1/200 minus 1/256 or about 22%. Consequently, the combined signal is not monotonic but includes periodically occurring non-monotinic portions after each increment of the eight MSBs of the digital value, as shown in waveform "c".

The first 512 increments of the combined signal shown in waveform "c" are shown in an expanded form and the remaining increments, 512 to 65,535 are shown in a condensed form for simplicity. The maximum digital value of the 16-bit digital word after 216 or 65,536 steps corresponds to the maximum average DC value obtainable, i.e., V.

Thus, there are 65,536 resolution elements for precisely deriving an analog signal. However, due to the non-monotonicity of the conversion, after each non-monotonic increment there are groups of digital values which cause the combined signal to repeat previously provided incremental values. For example, during time interval $t_1$, the value of the digital word provided by counter 10 is increased from 0 to 255 and the average DC value of the combined signal after 255 increments is approximately V/200. However, at the beginning of time interval $t_2$ the average DC value of the combined signal drops and approximately 56 positive increments of the digital word are required before it agains reaches an average DC value of V/200. The remainder of the apparatus shown in FIG. 1, in accordance with the principles of the invention, rapidly changes the value of the digital word after a non-monotonic increment, so as to substantially eliminate non-monotonicity in the filtered analog output signal.

Referring to FIG. 1, a detector 32 is responsive to the eight LSBs of the digital word for providing an output signal just before the DAC output provides a non-monotonic increment. Detector 32 may comprise, for example, an 8-bit EXCLUSIVE-NOR gate for providing an output pulse upon sensing that the eight LSBs are all ones (which condition immediately precedes a non-monotonic increment when counter 10 is changing in the positive sense) and for providing an output pulse upon sensing that the eight LSBs are all zeros (which condition immediately precedes a non-monotonic increment when counter 10 is changing in the negative sense). The output signal of detector 32 is applied to the set input (S) of a set-reset flip-flop 34. In response to the signal at its set input, flip-flop 34 provides a high logic level signal at its "Q" output. That high level signal is coupled to a sample and hold circuit 36 for causing it to sample and hold the DAC analog output signal level obtained immediately before each non-monotonic increment. The held signal level ($V_H$) is applied to one input of a comparator 38. Additionally, the Q output signal of flip-flop 34 is applied to switch 12 for causing it couple a relatively fast clock signal (e.g., 10 KHz) from a clock source 40 to the clock (C) input of counter 10 and uncouple the relatively slow clock signal (1 KHz) of clock source 14 from counter 10. In response, the digital values of counter 10 are rapidly incremented from the non-monotonic increment. The rapidly incremented digital values correspond to DAC output signal levels which repeat previously provided output signal levels preceding the non-monotonic increment.

A reset input (R) of comparator 38 is responsive to the DAC output signal ($V_{out}$) and provides a signal to reset flip-flop 34, when the DAC output level has reached the output it obtained immediately preceding the non-monotonic increment. When flip-flop 34 is reset by the output of comparator 38, switch 12 is caused to again couple clock source 14 instead of clock source 40 to counter 10 in order that the counter may resume its relatively slow incrementing.

Referring again to waveform "c" of FIG. 2 the operation of the invention will now be described for the condition when counter 10 is incremented positively from an all zero state in response to clock signals from clock source 14. Counter 10 will increment from zero to 255 at the 1 KHz rate during time interval $t_1$. At count 255, detector 32 provides a signal to the "S" input of flip-flop 34 and the average DC value of the DAC output signal at count 255 is held by sample and hold circuit 36 and applied to one input of comparator 38. The held signal level is indicated as $V_H$ on waveform "c". Then, flip-flop 34, switch 12 and clock source 40 cause counter 10 to increment ten times faster until comparator 38 indicates the DAC output signal level has again reached $V_H$. Due to this fast incrementing, the $t_2$ time interval is reduced by a factor of ten, as indicated by the time interval $t_2'$. At the end of time interval $t_2'$, counter 10 resumes its relatively slow incrementing. It is noted that although the all zeros of count 256 will also be detected by detector 32 immediately after detecting the all ones of count 255, this will not effect the sample and hold circuit 36 or switch 12 since the output of flip-flop 34 will not change in response to a second signal applied to its "S" input.

Thus, approximately 56 increments of waveform "c" occur very rapidly during the relatively short time interval $t_2'$, effectively eliminating the non-monotonic portion from the filtered output signal of the DAC. This is illustrated in waveform "c" by the dashed lines which begin at the end of time interval $t_2'$ and show successive and uniform increments of average DC value after count 255.

The DAC of FIG. 1 can be used in a TV receiver for providing a sweep type tuning voltage to the local oscillator portion of a TV tuner 42 for sequentially tuning successive channels. In this case it is desirable to include a further lowpass filter 46 having a relatively long time constant as compared with the time constant of lowpass filter 24 for providing additional smoothing of $V_{out}$ so as to generate a $V'_{out}$ which is suitable for use as the sweep type tuning voltage. A channel selector 44, which may comprise a conventional viewer operated channel selection push button arrangement including up and down push buttons, when operated by a TV viewer, provides the enable (E) signal and the respective high and low logic levels as the U/D signal. In response to successively increasing (or decreasing) analog signal levels at the output of the DAC, successively higher (or lower) order channels are tuned by TV tuner 42. When the viewer sees that a desired TV channel is being received, the push button of channel selector 44 is released and the enable "E" signal is no longer applied to counter 10. This causes counter 10 to stop counting.

If the non-monotonic portion of the DAC output signal were not substantially eliminated as provided by the apparatus of the present invention, it would be possible for a single channel to be tuned twice, (for example, once at a digital value of 255 and then again at a digital value of approximately 315). This would tend to confuse the viewer as to which channel is being tuned.

Figure 3:
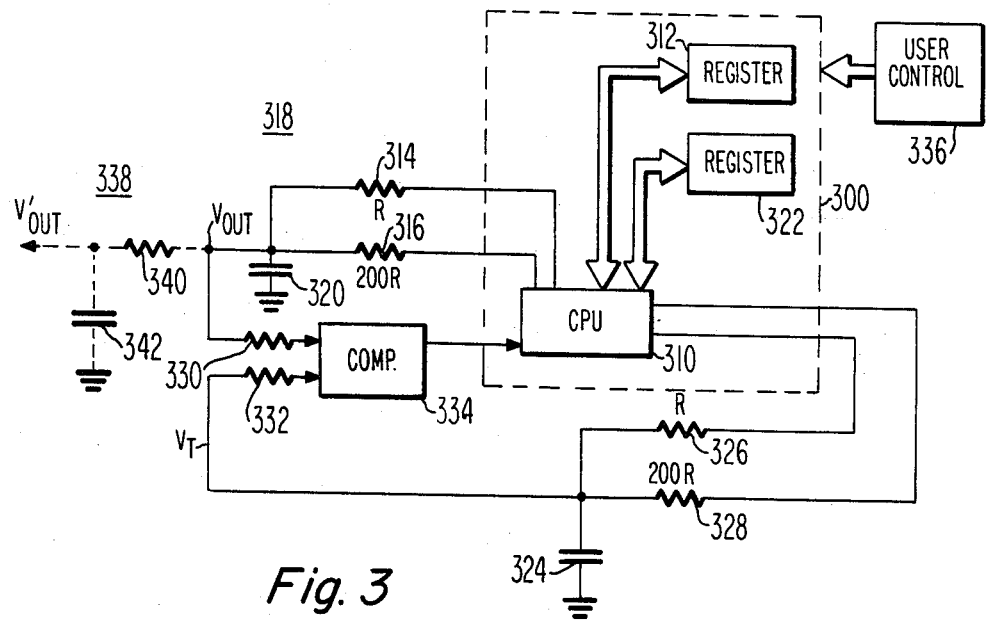
FIG. 3 illustrates, partially in block diagram form and partially in schematic diagram form, an alternative embodiment of a DAC constructed in accordance with the principles of the invention using a microcomputer in place of the discrete logic shown in FIG. 1.

In the arrangement shown in FIG. 3, a microcomputer 300 replaces a substantial portion of the circuitry illustrated in FIG. 1 for providing a DAC in accordance with the principles of the present invention. A central processing unit (CPU) 310 of microcomputer 300, in combination with a register 312 comprising a memory location of a random access memory (RAM) which stores a 16-bit digital word representing an analog voltage, supplies COARSE and FINE pulse output signals representative of the eight MSBs and eight LSBs of the digital word to resistors 314 and 316, respectively. A lowpass filter 318 includes resistors 314 and 316 for differentially weighting and combining the pulse output signals for generating an analog signal ($V_{out}$) across a capacitor 320 in a manner similar to that described above with respect to FIG. 1.

For providing the COARSE and FINE pulse signals (representative of the eight MSBs and eight LSBs respectively, of the digital word stored in register 312), microcomputer 300 sets up a time interval having 256 increments. Once each increment of the time interval, CPU 310 adds the eight MSBs to the contents of an accumulator. If a ninth bit (a carry bit) results from the addition, a high signal level is applied to resistor 314, but, if a carry bit is not generated, a low signal level is applied to resistor 314. A flow chart for this algorithm is indicated in FIG. 4. After the FIG. 4 process is repeated 256 consecutive times, the output signal developed across resistor 314 will have a duty-factor (and hence an average DC value) which is representative of the digital value of the eight MSBs. Consider, for example, the binary number 01 which corresponds to 25% of the maximum digital value able to be represented by two bits. By successively adding 01 to any 2-bit number, a carry bit would be generated 25 of the time. A duty-factor signal is generated across resistor 316 in response to the eight LSBs of the digital word stored in register 312 in the same manner as for the eight MSBs.

For providing the function of the sample and hold circuitry of FIG. 1, microcomputer 300 includes a second 16-bit register 322, also a RAM memory location, for storing values of a digital word which develops a voltage $V_T$ across a capacitor 324 which tracks the voltage $V_{out}$ developed across capacitor 320. The tracking voltage $V_T$ is developed by differential weighting of two additional pulse signals provided by CPU 310 to resistors 326 and 328, respectively, in a manner similar to that described above for generating the voltage $V_{out}$. The voltages $V_{out}$ and $V_T$ are applied by equal value resistors 330 and 332, respectively, to the inputs of a voltage comparator 334. Comparator 334 provides a high level signal to CPU 310 when the voltage difference between its inputs is less than one-half of an incremental level of $V_{out}$ in order that comparator 38 can accurately detect when $V_{out}$ has tracked $V_T$. Preferably, the time constant of low pass filter 318 is relatively short in order that comparator 334 can quickly indicate to CPU 310 if $V_{out}$ has tracked $V_T$. When the DAC of FIG. 3 is used for providing the tuning signal in a TV receiver, it may be desirable to include a further low pass filter 338, including a resistor 340 and a capacitor 342 (shown in dashed lines) having a relatively long time constant for providing additional smoothing of $V_{out}$ so as to generate a $V'_{out}$ which is suitable for use as the tuning signal.

The operation of FIG. 3 will next be described in conjunction with the flow chart of the control program of microcomputer 300 illustrated in FIG. 5.

A user control 336 e.g., similar to channel selector 44 of FIG. 1, provides commands to microcomputer 300 for controlling the operation of the DAC. Assume, for purposes of example, user control 336 commands microcomputer 300 to generate an increasing analog signal output. Upon receiving this command, CPU 310 initializes registers 312 and 322 by establishing a minimum digital value in each register and then sequentially increments the digital values in registers 312 and 322 in accordance with steps 500 to 550 of the program illustrated in FIG. 5 so as to generate a monotonically increasing analog voltage $V_{out}$ from the digital values stored in register 312 and a voltage $V_T$ from the digital values stored in register 322 which tracks the amplitude levels of the voltage $V_{out}$. Due to slight differences in the size of the amplitude increments of $V_{out}$ and $V_T$, which may result from actual resistance value differences between resistors 314, 316 and resistors 326, 328, CPU 310 may sense the output of comparator 334 during step 550 of the control program to ensure that $V_T$ tracks $V_{out}$.

When CPU 310 senses that $V_{out}$ is about to undergo a non-monotonic increment, i.e., the eight LSBs of the digital word stored in register 312 are all ones, CPU 310 proceeds from step 540 of the program to the loop including steps 560, 570 and 580 such that CPU 310 no longer increments the value of the word stored in register 322 and instead rapidly increments the value of the digital word stored in register 312 until comparator 334 provides a signal to CPU 310 indicating that $V_{out}$ has now tracked $V_T$. Thereafter, CPU 310 continues the sequential incrementing of registers 312 and 322 until CPU 310 again senses a non-monotonic increment is imminent, in which case the above described process is repeated. If user control 336 had commanded microcomputer 300 to generate a decreasing analog signal, the value of the digital word stored in registers 312 and 322 would be initialized to a maximum value and then sequentially decreased. The operation would be substantially the same as described above except that CPU 310 would sense that $V_{out}$ was about to undergo a non-monotonic increment when the eight LSBs of the digital word were all zeros.

Thus, the operation of the embodiment of FIG. 3 is similar to the embodiment of FIG. 1. In both the FIG. 1 and FIG. 3 embodiments, means are provided for detecting the occurrence of a non-monotonic increment, for storing a signal representative of the DAC output level just prior to the non-monotonic increment and, for rapidly changing the DAC output signal level after the occurrence of a non-monotonic increment until it again equals the value it was just prior to the non-monotonic increment.

It should be clear to those skilled in the art that there are other embodiments capable of performing these functions. For example, for detecting the occurrence of each non-monotonic change in FIG. 3, $V_{out}$ and $V_T$ can be applied to the inputs of an additional voltage comparator for providing an output signal to control 310 when the amplitude difference between $V_{out}$ and $V_T$ changes by an amount greater than expected. Furthermore, although in FIG. 3 $V_T$ is generated in the same manner and with the same number of bits in the digital word as is used to generate $V_{out}$, other methods of generating a tracking voltage may be used. Additionally, the rapid changing of the value of the digital word after a non-monotonic increment is sensed may be accomplished in other ways consistant with the scope of the invention. For example, when the system is initially energized, a calibration sweep may be initiated wherein the digital values corresponding to the values which restore the analog signal level to the level it was immediately before each non-monotonic increment are stored in a RAM memory location (e.g., in microcomputer 300). During operation, each of these digital values is subsequently loaded into register 312 (of FIG. 3) after the detection of the respective non-monotonic increment, in order to reduce the time required to recover the analog signal level to the level obtained immediately prior to the occurrance of the non-monotonic increment. These and other modifications of the illustrated embodiments are considered to be within the scope of the following claims.

What is claimed is:

1. In a digital-to-analog converter which generates an analog output signal subject to periodically occurring non-monotonic increments in response to consecutive increments of the value of a digital word, apparatus for substantially reducing magnitude disturbances of said analog signal caused by said non-monotonic increments comprising:

means for detecting the occurrence of each of said non-monotonic increments of said analog signal;

means for rapidly changing the value of said digital word so as to rapidly change the magnitude of said analog signal in response to the detection of the occurrence of each of said non-monotonic increments;

means for storing signals having magitudes related to the magnitudes of said analog signal prior to each of said non-monotonic increments; and sensing means having a first input responsive to the magnitude of said analog signal and a second input responsive to the magnitude of said stored signal for stopping said rapid changing of the value of said digital word when the magnitude of said analog signal corresponds to the magnitude of said stored signal.

2. Apparatus according to claim 1 wherein said detecting means is responsive to said digital word and provides an indication signal upon detecting a value of said digital word which precedes each of said non-monotonic increments by a predetermined number of increments.

3. Apparatus according to claim 2 wherein said detecting means provides said indication signal at a digital value which immediately precedes each of said non-monotonic increments.

4. Apparatus according to claim 2 wherein said digital word is generated by a counter; and said means for rapidly changing the value of said digital word includes means for increasing the rate at which said counter is changed, said rate increasing means being responsive to said indication signal for beginning said rapid changing.

5. Apparatus according to claim 4 wherein said sensing means includes a voltage comparator.

6. Apparatus according to claim 5 wherein said storing means includes a sample and hold circuit coupled to receive said analog signal for maintaining at its output the amplitude level of said analog signal in response to said indication signal.

7. Apparatus according to claim 5 wherein said storing means includes means for generating a tracking signal having amplitude changes related to amplitude changes of said analog signal until the occurrence of said indication signal, and for stopping the amplitude changes of said tracking signal in response to said indication signal.

8. Apparatus according to claim 7 wherein said means for generating said tracking signal is responsive to the output signal of said sensing means for causing said tracking signal to again have amplitude changes related to the amplitude changes of said analog signal when the magnitude of said analog signal corresponds to the amplitude of said tracking signal generated at the occurrence of said indication signal.

9. Apparatus for converting a digital word including a plurality of bits to an analog signal comprising:
first means for converting a first group of the most significant bits of said digital word to a first pulse signal having an incrementally variable duty factor;
second means for converting a second group of the next most significant bits of said digital word to a second pulse signal having an incrementally variable duty factor;
means for combining said first and second pulse signals to produce at its output an analog signal having periodically occurring non-monotonic increments in response to consecutive increments of the value of said digital word;
means for detecting the occurrence of each of said non-monotonic increments of said analog signal;
means for rapidly changing the value of said digital word so as to rapidly change the magnitude of said analog signal in response to the detection of the occurrence of each of said non-monotonic increments;
means for storing signals having magnitudes related to the magnitudes of said analog signal prior to each of said non-monotonic increments; and
sensing means having a first input responsive to the magnitudes of said analog signal and a second input responsive to the magnitude of said stored signal for stopping said rapid changing of the value of said said digital word when the magnitude of said analog signal corresponds to the magnitude of said stored signal.

10. Apparatus according to claim 9 wherein said detecting means includes an EXCLUSIVE-NOR function means responsive to said second group of bits for providing an indication signal at a digital value which immediately precedes each of said non-monotonic increments.

11. Apparatus according to claim 10 wherein said storing means includes third means for converting a first group of the most significant bits of a tracking digital word to a third pulse signal having an incrementally variable duty factor;
fourth means for converting a second group of the next most significant bits of said tracking digital word to a fourth pulse signal having an incrementally variable duty factor; and
means for combining said third and fourth pulse signals to produce at its output a second analog signal having amplitude changes related to amplitude changes of said first-mentioned analog signal.

12. Apparatus according to claim 11 wherein said third and fourth converting means are each responsive to said indication signal for stopping the amplitude changes of said second-mentioned analog signal; wherein said first mentioned digital word is generated by a counter; and said means for rapidly changing the value of said first-mentioned digital word includes means for increasing the rate at which said counter is changed, said rate increasing means being responsive to said indication signal for initiating said rapid changing.

13. The apparatus of claim 12 wherein said means for combining said first and second pulse signals includes a first resistor coupled to receive said first pulse signal, a second resistor coupled to receive said second pulse signal and a first integrating circuit coupled to the ends of said first and second resistors; and said means for combining said third and fourth pulse signals includes a third resistor coupled to receive said third pulse signal, a fourth resistor coupled to receive said fourth pulse signal and a second integrating circuit coupled to the ends of said third and fourth resistors, said first and second mentioned analog signals being developed by said first and second integrating circuits, respectively.

14. The apparatus of claim 13 wherein said non-monotonicity of said first-mentioned analog signal results in a given percentage of its amplitude change being subject to being repeated and, said first, second, third and fourth resistors have an actual resistance value tolerance relative to a nominal resistance value of substantially one-half said given percentage.

15. In a television tuning system including an oscillator responsive to a tuning signal for generating a local oscillator signal, channel selector means for providing signals representative of a selected channel and a digital-to-analog converter responsive to said signals provided by said channel selector means for generating an analog signal from which said tuning signal is derived, said analog signal being subject to periodically occurring non-monotonic changes in response to consecutive changes of the value of a digital word, apparatus for substantially reducing magnitude disturbances of said analog signal caused by said non-monotonic changes comprising:
means for detecting the occurrence of each of said non-monotonic changes of said analog signal;
means for rapidly changing the value of said digital word so as to rapidly change the magnitude of said analog signal in response to the detection of the occurrence of each of said non-monotonic changes;

means for storing signals having magnitudes related to the magnitude of said analog signal prior to each of said non-monotonic changes; and sensing means having a first input responsive to the magnitude of said analog signal and a second input responsive to the magnitude of said stored signal for stopping said rapid changing of the value of said digital word when the magnitude of said analog signal corresponds to the magnitude of said stored signal.

16. Apparatus according to claim 15 wherein said digital-to-analog converter develops said analog signal at the output of a first lowpass filter and said tuning voltage is developed at the output of a second lowpass filter.

17. Apparatus according to claim 16 wherein the time constant of said first lowpass filter is shorter than the time constant of said second lowpass filter.

* * * * *